(12) United States Patent
Gharpurey et al.

(10) Patent No.: US 6,476,668 B2
(45) Date of Patent: Nov. 5, 2002

(54) FAST-SETTING, LOW POWER, JAMMER INSENSITIVE, BIASING APPARATUS AND METHOD FOR SINGLE-ENDED CIRCUITS

(75) Inventors: Ranjit Gharpurey, Plano, TX (US); Gugliemo Sirna, Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/096,775

(22) Filed: Mar. 13, 2002

(65) Prior Publication Data

US 2002/0121936 A1 Sep. 5, 2002

Related U.S. Application Data

(62) Division of application No. 09/797,153, filed on Mar. 1, 2001.
(60) Provisional application No. 60/249,370, filed on Nov. 16, 2000.

(51) Int. Cl.[7] .................................................. G05F 1/10
(52) U.S. Cl. .................. 327/538; 327/545; 327/315; 327/316; 330/285; 330/296; 455/250.1
(58) Field of Search .................................. 330/283, 285, 330/288, 296; 455/250.1; 327/530, 538, 545, 315, 316

(56) References Cited

U.S. PATENT DOCUMENTS

| | | | | |
|---|---|---|---|---|
| 5,124,586 A | * | 6/1992 | Carobolante | 327/574 |
| 5,136,250 A | * | 8/1992 | Abdelli | 324/661 |
| 5,703,504 A | * | 12/1997 | Chun et al. | 327/72 |
| 6,323,723 B1 | * | 11/2001 | Gül et al. | 327/538 |
| 6,331,799 B1 | * | 12/2001 | Miyazawa | 327/538 |

* cited by examiner

*Primary Examiner*—Michael B Shingleton
(74) *Attorney, Agent, or Firm*—April M. Mosby; W. James Brady; Frederick J. Telecky, Jr.

(57) ABSTRACT

A single-ended circuit, such as an LNA (300), in accordance with the present invention includes an input power matching circuit (310) and a bias circuit (305) connected to an output transistor ($Q_{in}$) which provides the amplification. A degeneration inductance ($L_e$) and load impedance ($L_o$) couple to the emitter and collector of the output transistor ($Q_{in}$), respectively. The bias circuit (305) is configured to eliminate base shot-noise of the mirror transistor ($Q_1$) which generates the amplification. The bias circuit (305) in accordance with the present invention also eliminates the noise of the bias resistor ($R_{x1}$) that is included within the bias circuit (305). Specifically, the bias circuit (305) includes a current reference source ($I_{ref}$) and an emitter follower circuit (315) connected to a current mirror circuit ($Q_1$, $Q_2$, $R_{x2}$) that connects to a bias resistor ($R_{x1}$). This bias circuit (305) can be implemented in a wide-class of single-ended circuits.

2 Claims, 3 Drawing Sheets

US 6,476,668 B2

FAST-SETTING, LOW POWER, JAMMER INSENSITIVE, BIASING APPARATUS AND METHOD FOR SINGLE-ENDED CIRCUITS

CROSS-RELATED APPLICATIONS

This application is a Division and claims priority under 35 USC §121 from utility application Ser. No. 09/797,153 filed Mar. 1, 2001 which claims priority under 35 USC §119(e)(1) of provisional application Ser. No. 60/249,370, filed Nov. 16, 2000.

FIELD OF THE INVENTION

The invention relates to semiconductor devices, and, more particularly, to a fast-settling, low power, biasing circuit for single-ended circuits that are insensitive to jammers.

BACKGROUND OF THE INVENTION

Radio Frequency (RF) receivers include preamplifiers to boost an incoming signal level prior to the frequency conversion process. The presence of intermodulation products produced by large interfering signals compromises the receiver's ability to process very weak signals. This is what is conventionally known as desensitization. Third-order intermodulation occurs when two interfering signals at differing frequencies combine in the amplifier third-order nonlinearity to produce an intermodulation product close to the desired signal.

Desensitization may also occur when a single large interfering signal (i.e. a blocker or jammer) is present. The reduction in sensitivity arises through two separate mechanisms. The first, gain compression, is caused by third-order nonlinearity in the circuit, allowing the existing noise source in the amplifier and mixer to exert a relatively larger influence, thus degrading the overall signal to noise performance. The second mechanism, second-order nonlinearity in the circuit, promotes mixing between relatively low-frequency noise sources in the amplifier and the interfering signal. As a result, low-frequency noise is up-converted to the desired signal frequency which degrades the circuit noise performance. More on the study of blocking and desensitization can be found in "Blocking and Desensitization in RF Amplifiers," R. G. Meyer and A. K. Wong, IEEE (1995), which is incorporated by reference herein.

Particularly, desensitization occurs in single-ended circuits, such as single-ended front-end Low-Noise Amplifiers (LNAs) for wireless receivers, that operate in the presence of jammers due to an increase in the noise floor at the output of the circuit and gain compression. Essentially, distortion in the circuit causes an up-conversion of low-frequency noise into the band of interest. This added noise increases the noise-floor of the circuit, that causes the Signal-to-Noise Ratio (SNR) at the output of the amplifier to degrade considerably in the presence of large amplitude jammers.

A typical signal-transistor LNA is shown is FIG. 1a. This single-transistor LNA circuit includes a transistor $Q_{in}$ as its primary gain device. As shown, power supply $P_s$ applies a voltage input to the circuit. An output is observed at output node $P_{out}$. The bias circuit is composed of transistors $Q_1$ and $Q_2$, that act as mirror devices. If the device area of transistors $Q_{in}$ and $Q_1$ is $A_{in}$ and $A_1$, respectively, then the current flowing through transistor $Q_{in}$ is $I_{ref}(A_{in}/A_1)$. A resistor $R_{x1}$ is added in series with the bias circuit, to ensure that the incoming Radio Frequency (RF) power is not diverted into the bias circuit and is supplied primarily to transistor $Q_{in}$ for proper amplification. Since a base current flows into transistor $Q_{in}$, a static voltage drop develops across resistor $R_{x1}$. In order to balance this drop, a resistor $R_{x2}$ is added in series with the base of transistor $Q_1$. Note that the base current in transistor $Q_{in}$ equals the base current of transistor $Q_1$ multiplied by $A_{in}/A_1$. Therefore in order to balance the base-current drops, resistor $R_{x2}$ must equal $R_{x1}(A_{in}/A_1)$.

In practice, an RF signal represented by $v_a \cos(\omega t)$ may be applied to the input of the LNA circuit; meanwhile a jammer signal of strength $v_a' \cos((\omega+\Delta\omega)t)$ may be applied to the input of the LNA as well. The jammer is much larger than the incoming RF signals in most wireless standards. For example, the Global System for Mobile Communication (GSM) standard requires that a sensitivity of −102 dBm be maintained for the receiver. The receiver is required to demonstrate an identical signal-to-noise ratio at the output when the LNA input power is 99 dBm and a jammer is present at 3 MHz at a power level of −23 dBm this requires minimal degradation of the receiver noise figure in the presence of the jammer. With this level of jammer signal, low-frequency noise can be up-converted as explained above. At node 1, there exists low-frequency noise from the bias circuit output. Due to second-order harmonic distortion inherent in the LNA, the jammer tone beats with low-frequency noise at frequency $\Delta\omega$, and translates the noise to frequencies to $\omega+\Delta\omega+\Delta\omega$ and $\omega+\Delta\omega-\Delta\omega$. The latter term is at the same frequency as the desired signal. Thus, the SNR ratio at the desired output frequency suffers. It should be noted that this effect scales with the strength of the jammer, such that is the SNR degrades more for larger jammer strengths. This effect is shown in FIGS. 1b and 1c.

The following noise sources impact the total noise at low frequencies in the bias circuit: a) the noise of the reference bias ($I_{ref}$), b) the noise of bias resistor $R_{x2}$, c) the base shot-noise of transistor $Q_1$, and d) the collector shot-noise of transistor $Q_1$. Several other noise sources, however, may exist in a LNA circuit; yet, their impact is negligible. As a consequence of the tightly coupled feedback loop formed by transistors $Q_1$ and $Q_2$ and resistor $R_{x2}$, the impedance seen by the reference current source, $I_{ref}$, is of the order of the inverse of the transconductance $g_m$ of transistor $Q_1$. This is a small quantity in most bias circuits. Consequently, the noise of the reference bias circuit is small at its output, node X. In addition, as a result, the collector shot-noise of transistor $Q_1$ is mitigated. The remaining noise sources noted above in b) and c) are major noise sources in the LNA circuit shown in FIG. 1a, since this circuit presents these noise sources with a relatively high impedance at the base of transistor $Q_1$. Thus, noise current at this node develops a large noise voltage, which is effectively amplified by transistor $Q_1$ at its collector node. Since transistor's $Q_2$ placement with adjacent elements is such that it represents a voltage follower circuit, any noise at its base appears on its emitter with little attenuation. Hence, a large noise voltage develops at the base of transistor $Q_{in}$. As explained above, this low-frequency noise can be up-converted to RF frequencies.

An approach that has been used to mitigate the noise up-conversion, is the use of external passive LC filters at the input node of the LNA circuit, or at the collector of transistor $Q_1$, is shown in FIG. 2. The indicated LC circuit including inductor $L_n$ and capacitor $C_n$ creates a notch in the frequency domain at the frequency equal to the difference between the jammer and the signal-frequency. Thus, any noise on the bias line is filtered off at this frequency. The notch LC filter is so designed, that it appears as a very high impedance at the radio-frequency, and hence has a minimal impact on circuit performance. The LC notch circuit is effective in reducing the influence of the jammer.

This approach, however, has several disadvantages. First, it requires the use of external inductor and capacitor elements which add to the total cost of the solution. Second, the value of the capacitor in the notch filter is relatively high, since the filtering action is required at low frequencies. As a consequence, when the amplifier is powered on, it requires a long time to settle to its steady state, often in the order of hundreds of microseconds, which may be unacceptable in the overall system. Third, parasitics introduced by the large external components can degrade RF performance.

It should also be pointed out, that the solution of using a tuned series LC circuit applied at the input of the amplifier is very effective in suppressing the noise of resistor $R_{x1}$ and the base shot noise of transistor $Q_{in}$ as well, in addition to suppressing the noise of the bias circuit. However, there are several practical problems with this implementation as mentioned above namely increase in the cost because of added external components, slow turn-on time, and worsened RF performance due to added parasitics of the external tank components. If a noise filter is used at the collector of transistor $Q_1$, it will show the same small increase due to the noise from resistor $R_{x1}$, and the base shot noise of transistor $Q_{in}$.

Thus, a need exists for a fast settling, low power biasing technique for a single-ended circuit.

SUMMARY OF THE INVENTION

To address the above-discussed deficiencies of the biasing circuitry for single-ended circuits, the present invention teaches a fast settling, low power biasing circuit and method for single-ended circuits. In particular, a LNA in accordance with the present invention includes an input power matching circuit, an output transistor, a bias circuit, a degeneration inductance, and a load impedance. The input power matching circuit and the bias circuit couple to the output transistor which provides the amplification. The degeneration inductance and load impedance couple to the emitter and collector of the output transistor, respectively. The bias circuit is configured to eliminate base shot-noise of the transistor internal to the bias circuit that sets up the mirror current for the output transistor. The bias circuit in accordance with the present invention also eliminates the noise of the bias resistor that is included within the bias circuit.

Specifically, the bias circuit includes a current mirror circuit, a current reference source, the bias resistor, and an emitter follower circuit. The current reference source and the emitter follower circuit are connected to the current mirror circuit which connects to the bias resistor. This biasing circuit can be implemented in a wide-class of single-ended circuits.

Advantages of this design include but are not limited to a fully integratable solution which reduces up-converted noise due to the presence of jammer signals. Since an LNA circuit in accordance with the present invention can be fully integrated on-chip, the additional cost is negligible and, hence, acceptable. Further, the turn-on time of the circuit is small, and acceptable in most systems.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein.

DETAILED DESCRIPTION OF PREFERRED EMBODIMENTS

Figure 1A:
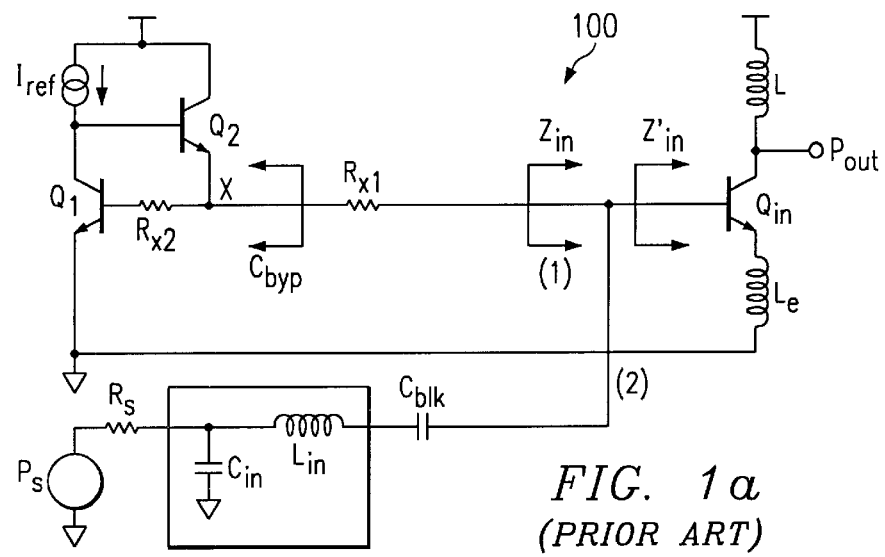
FIG. 1a is a known embodiment of a low-noise amplifier (LNA)
Figure 1B:
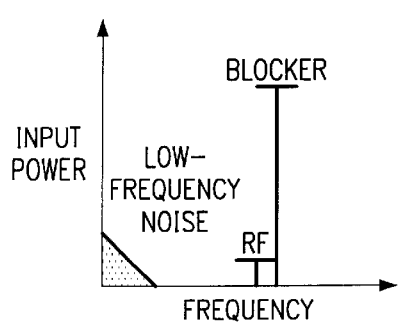
FIG. 1b is a diagram of the input power vs. frequency of the noise and the up-converted noise in the presence of a jammer signal.
Figure 1C:
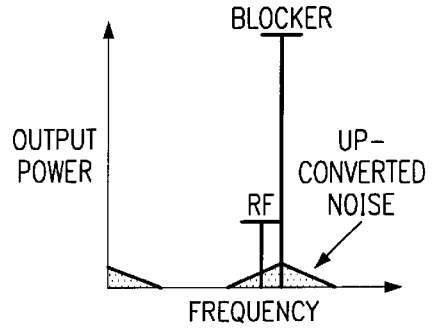
FIG. 1c is a diagram of the input power vs. frequency of the noise and the up-converted noise in the presence of a larger jammer signal.
Figure 2:
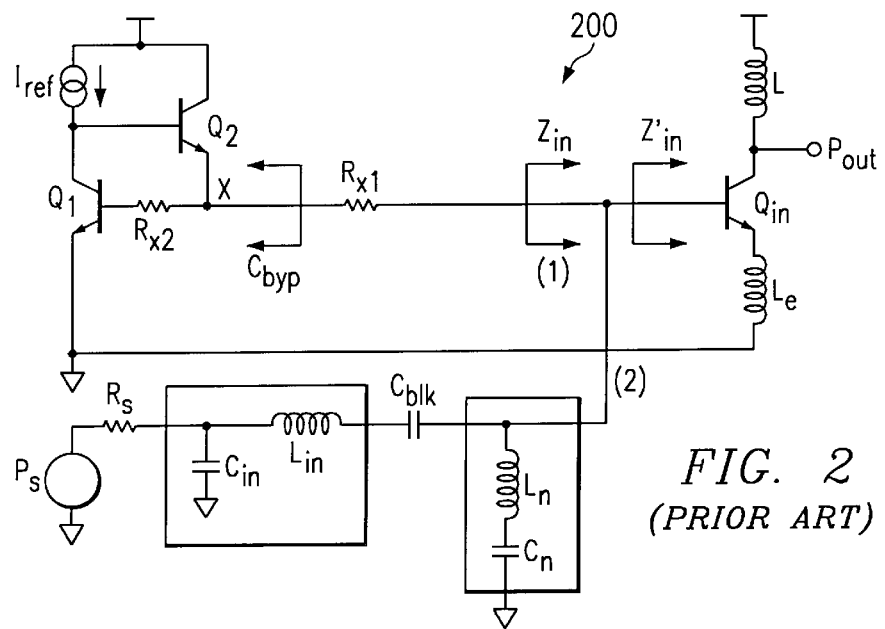
FIG. 2 is another known embodiment of a LNA.
Figure 3:
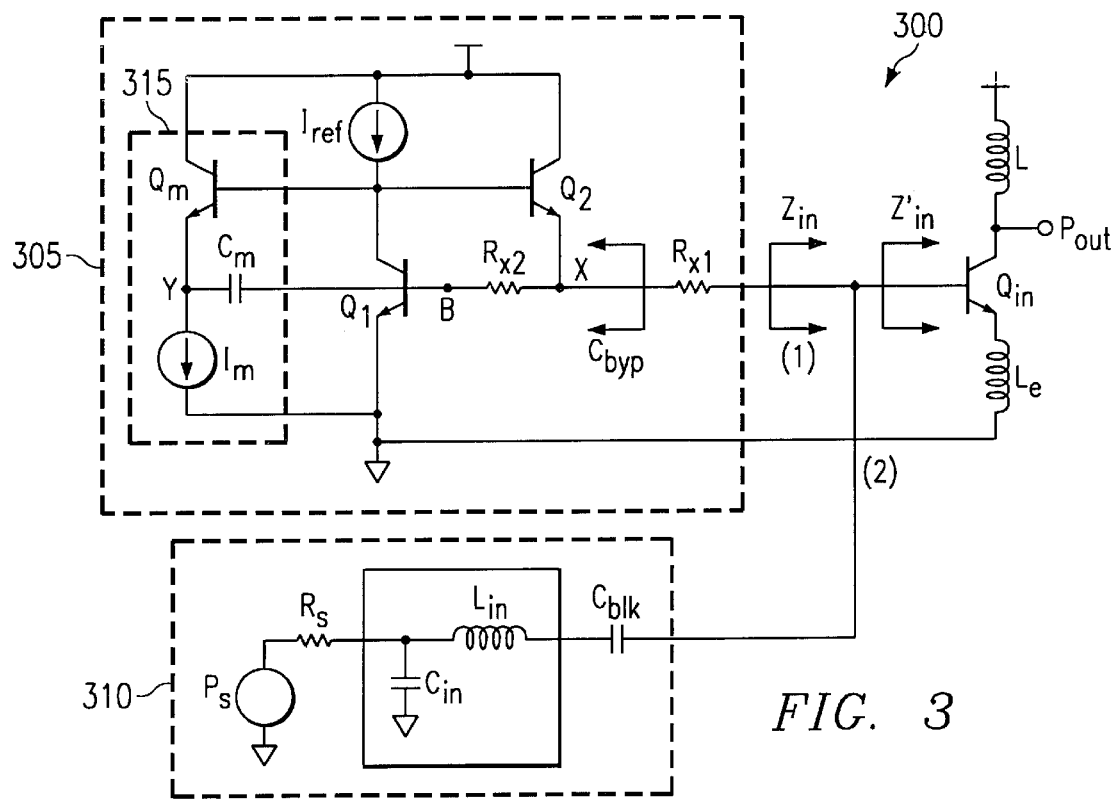
FIG. 3 is a embodiment of a LNA in accordance with the present invention.

The proposed biasing apparatus 300 and technique, as shown in FIG. 3, can be implemented in a wide-class of single-ended circuits. A single-ended circuit, such as an LNA 300, in accordance with the present invention includes an input power matching circuit 310 and a bias circuit 305 connected to an output transistor $Q_{in}$ which provides the amplification. A degeneration inductance $L_e$ and load impedance $L_o$ couple to the emitter and collector of the output transistor $Q_{in}$, respectively.

The bias circuit 305 is configured to eliminate base shot-noise of the transistor $Q_1$ which sets up the mirror current for $Q_{in}$. The bias circuit 305 in accordance with the present invention also eliminates the noise of the bias resistor $R_x$ that is included within the bias circuit 305. Specifically, the bias circuit 305 includes a current reference source $I_{ref}$ and an emitter follower circuit 315 connected to a current mirror circuit including elements $Q_1$, $Q_2$, $R_{x2}$ that connects to a bias resistor $R_{x1}$. This bias circuit 305 can be implemented in a wide-class of single-ended circuits.

More particularly, the design consists of a capacitor $C_m$, of a value that can be integrated on-chip using known integrated circuit (IC) processes (~5–20 pf), and an emitter follower circuit consisting of transistor $Q_m$, where the transistor $Q_m$ is biased with a small current of the order of a tenth of a milli-ampere ($I_m$). Transistor $Q_m$ is placed in an emitter follower configuration that connects to the collector of transistor $Q_1$. Since emitter followers are ideally unity gain voltage buffers, node X and node Y are ideally at the same potential. In effect, a low-frequency pole is introduced at a frequency of ½π$R_{x2}C_m$. Since resistor $R_{x2}$ is usually a large resistance, the value of capacitance $C_m$, required on-chip is small and can be integrated on-chip (in the order of 5–20 pF for most applications). In response to any current noise, $i_{bn}$, injected into the base of transistor $Q_1$, the voltage generated at the base is given by:

$$v_{bn}^2 \approx i_{bn}^2 \left( \left( \frac{R_{x2}^2}{1 + \omega^2 R_{x2}^2 C_m^2} \right) \Big/ (g_{mI} R_{cI})^2 \right)$$

where resistance $R_{c1}$ is the total load seen at the collector of transistor $Q_1$. The voltage at the collector of transistor $Q_1$ and hence at node X, is given by:

$$v_{Xn}^2 \approx i_{bn}^2 \left( \left( \frac{R_{x2}^2}{1+\omega^2 R_{x2}^2 C_m^2} \right) \right)$$

As shown, capacitor $C_m$ significantly attenuates the noise. If the −3 dB corner frequency above is, for example, 1 MHz, then at a 3 MHz offset, the noise will be attenuated by a factor of 10 or by 10 dB. In a similar fashion, the up-converted noise will also be attenuated by 10 dB. Another notable characteristic is that the attenuation increases with frequency.

Since the jammer in most systems is specified at a fixed offset compared to the desired RF signal, capacitor $C_m$ can be sized to provide adequate attenuation of the up-converted noise, through simulation, or hand analysis.

Figure 4:
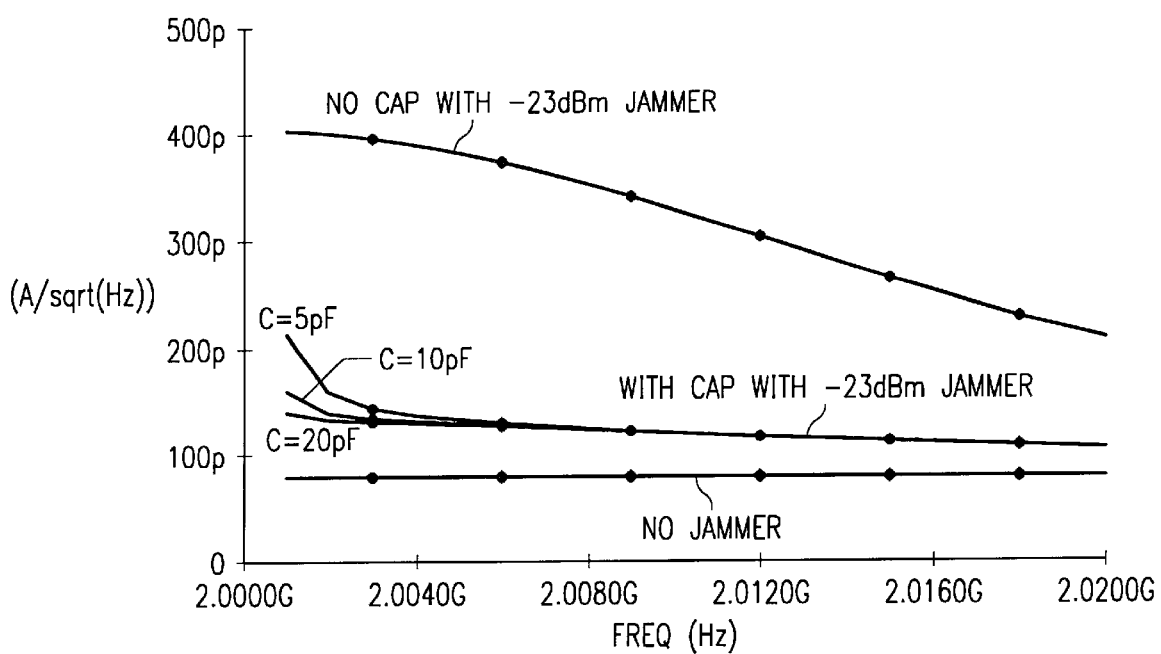
FIG. 4 is a diagram of the capacitance of capacitor $C_m$ vs. frequency in the presence of a jammer signal.

FIG. 4 illustrates the current noise at the output of the amplifier, with −90 dBm power input (no jammer) and −23 dBm input (with jammer), with and without the noise filtering circuit proposed here. Spectre RF was used for the simulation examples shown. The following component values have been assumed: Iref=0.2 mA, $R_{x2}$=32 kΩ, $R_{x1}$=2 kα. Three values of capacitor $C_m$ are displayed, including −5 pF, 10 pF and 20 pF.

With no jammer applied at the input, the noise at an offset of 3 MHz is approximately 82 pA/sqrt Hz. Without the solution proposed here, the noise increases to approximately 390 pA/sqrt Hz, due to the noise up-conversion process detailed earlier. In conclusion, the circuit reduces this noise to approximately 120 pA/sqrt Hz. Note that there is still a minor increase in the noise level compared to the case without a jammer due to a small increase in the noise floor and low-frequency noise from resistor $R_{x1}$ and transistor $Q_{in}$. The level of increase, however is acceptable in most systems, since in most wireless systems, a small increase in the noise floor is acceptable with an applied jammer. This implementation can be adapted by a circuit designer to meet system requirements.

Advantages of this design include but are not limited to a fully integratable solution which reduces up-converted noise due to the presence of jammer signals. Since an LNA circuit in accordance with the present invention can be fully integrated on-chip, the additional cost is negligible and, hence, acceptable. Further, the turn-on time of the circuit is small, and acceptable in most systems.

Figure 5:
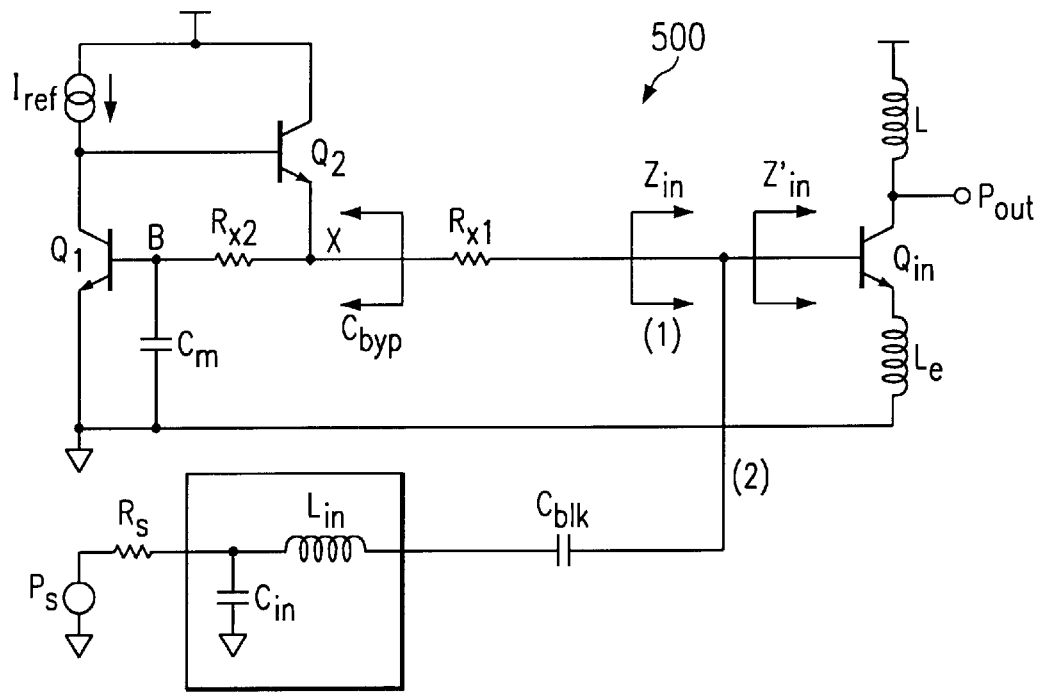
FIG. 5 is an alternate embodiment of a LNA.

A second embodiment as shown in FIG. 5 is an approach that reduces the noise because of the thermal noise of resistor $R_{x2}$ and the base shot noise of transistor $Q_1$, by placing a capacitor, between node B and ground. However, note that because of the tight feedback loop formed by transistor $Q_1$ and $Q_2$ around $R_{x2}$, the net impedance at node B is approximately resistance $R_{x2}$ divided by the loop gain of the feedback loop. The loop gain can be a large quantity, since it is set primarily by the transconductance $g_{m1}$ of transistor $Q_1$. Thus, the effective impedance at node B is small. Consequently, the capacitance required at the base of transistor $Q_1$ is too large for effective filtering and cannot be integrated.

Figure 6:
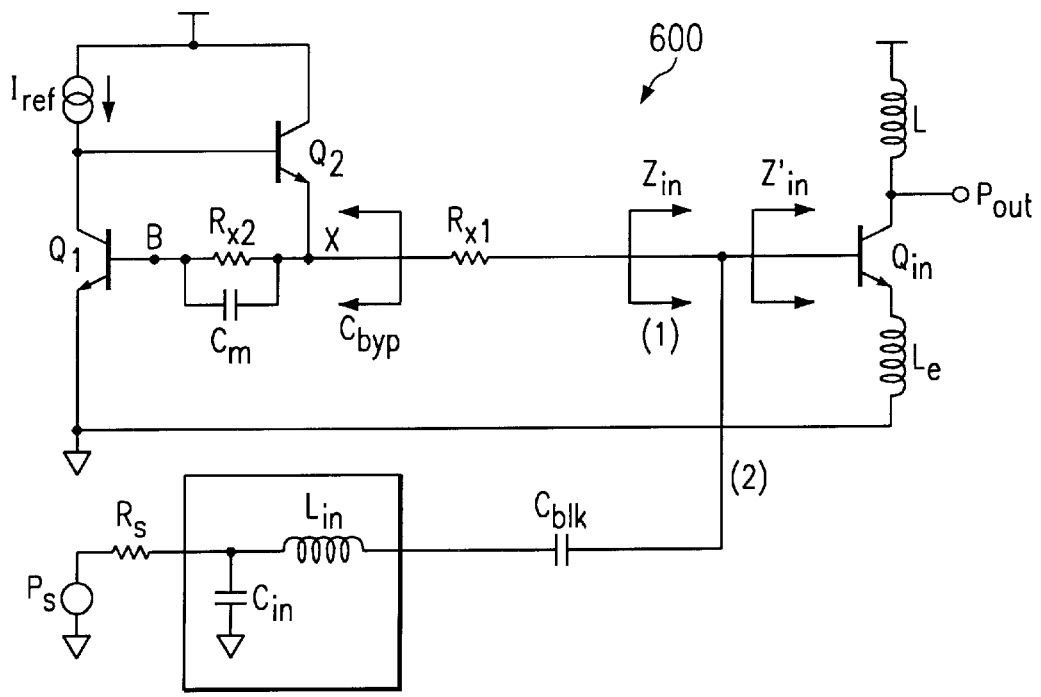
FIG. 6 is an alternate embodiment of a LNA.

A third embodiment includes as shown in FIG. 6 an approach of filtering the noise by placing a capacitor between nodes B and X. While this is effective, it introduces a new problem. At radio frequencies, this capacitor has a small impedance. Thus, the isolation from current $I_{ref}$ to the RF input port is severely compromised by this capacitor.

The reader's attention is directed to all papers and documents which are filed concurrently with this specification and which are open to public inspection with this specification, and the contents of all such papers and documents are incorporated herein by reference.

All the features disclosed in this specification (including any accompany claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

What is claimed is:

1. A single-ended circuit, having an input node, an output node, a power supply rail and ground, comprising:
  (a) a first inductor coupled to the input node;
  (b) a first capacitor coupled between the first resistor and ground;
  (c) a blocking capacitor coupled in series to the first inductor;
  (d) a biasing circuit comprising:
    (i) a first transistor, having a base, emitter and collector, the collector of the first transistor coupled to the power supply rail;
    (ii) a first current source coupled between the emitter of the first transistor and ground;
    (iii) a reference current source coupled between the power supply rail and the base of first transistor;
    (iv) a second transistor, having a base, emitter and collector, the collector of the second transistor coupled to the reference current source, and the emitter of the second transistor coupled to ground;
    (v) a second capacitor coupled between the emitter of the first transistor and the base of the second transistor;
    (vi) a third transistor, having a base, emitter and collector, the collector coupled to the power supply rail, the base coupled to the collector of the first transistor; and
    (vii) a second resistor coupled between the base of the second transistor and the emitter of the third transistor;
  (e) a third resistor coupled between the second resistor and the blocking capacitor;
  (f) a fourth transistor, having a base, emitter and collector, the base coupled to the third, the collector coupled to the output node;
  (g) a second inductor coupled between the emitter of the fourth transistor and ground; and (h) a third resistor inductor coupled between the power supply rail and the output node.

2. A bias circuit to filter noise comprising:
(a) an emitter follower circuit comprising
  (i) a first transistor having a base, collector and emitter;
  (ii) a current source coupled between the emitter of first transistor and ground; and
  (iii) a capacitor coupled to the emitter of the first transistor;
(b) a current mirror circuit coupled to the emitter follower circuit, the current mirror circuit comprising
  (i) a second transistor having a base, collector and emitter, the collector of the second transistor coupled to the power supply rail, the base of the second transistor coupled to the base of the first transistor; and
  (ii) a third transistor having a base, collector and emitter, the collector of the third transistor coupled to the base of the second transistor, the base of the third transistor coupled to the capacitor, the emitter of the third transistor coupled to ground; and
  (iii) a resistor coupled between the emitter of the second transistor and the base of the third transistor; and
(c) a current reference source coupled between the power supply rail and the base of the first transistor.

* * * * *